(12) United States Patent
Wu et al.

(10) Patent No.: US 10,879,266 B1
(45) Date of Patent: Dec. 29, 2020

(54) SEMICONDUCTOR DEVICE AND OPERATING METHOD THEREOF

(71) Applicant: MACRONIX INTERNATIONAL CO., LTD., Hsinchu (TW)

(72) Inventors: Guan-Wei Wu, Zhubei (TW); Yao-Wen Chang, Zhubei (TW); I-Chen Yang, Zhunan Township, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/744,592

(22) Filed: Jan. 16, 2020

(51) Int. Cl.
*H01L 27/11582* (2017.01)
*G11C 16/14* (2006.01)
*H01L 29/36* (2006.01)

(52) U.S. Cl.
CPC ........ *H01L 27/11582* (2013.01); *G11C 16/14* (2013.01); *H01L 29/36* (2013.01)

(58) Field of Classification Search
CPC .... H01L 27/11582; H01L 29/36; G11C 16/14
USPC .................................................. 365/185.29
See application file for complete search history.

(56) References Cited

U.S. PATENT DOCUMENTS

| 8,004,906 | B2 | 8/2011 | Hong et al. |
| 9,330,778 | B2 | 2/2016 | Costa et al. |
| 10,355,015 | B2* | 7/2019 | Zhang ................ G11C 16/0483 |
| 10,622,369 | B2* | 4/2020 | Zhou ................ H01L 27/11548 |
| 2017/0229472 | A1* | 8/2017 | Lu ........................ H01L 21/3003 |
| 2018/0331118 | A1* | 11/2018 | Amano ............. H01L 21/76858 |
| 2019/0013326 | A1 | 1/2019 | Hua et al. |

FOREIGN PATENT DOCUMENTS

| CN | 101325088 A | 12/2008 |
| CN | 106876401 B | 6/2017 |

* cited by examiner

*Primary Examiner* — Fernando Hidalgo
(74) *Attorney, Agent, or Firm* — McClure, Qualey & Rodack, LLP

(57) ABSTRACT

A semiconductor device includes a substrate including a doped region of a first doping concentration that extends downward from an upper surface of the substrate; a first stack on the upper surface, including first insulating layers and first conductive layers alternatively stacked, a first channel layer, a first memory layer and a first conductive connector configured to receive a first voltage, the first conductive connector on the first channel layer, having a second doping concentration; a second stack on the first stack including second insulating layers and second conductive layers alternatively stacked, a second channel layer, a second memory layer, the second conductive layer configured to receive the second voltage; a second conductive connector on the second channel layer, configured to receive an erasing voltage, the first conductive connector electrically connected to the first and second channel layers; the first doping concentration smaller than the second doping concentration.

18 Claims, 3 Drawing Sheets

SEMICONDUCTOR DEVICE AND OPERATING METHOD THEREOF

BACKGROUND OF THE INVENTION

Field of the Invention

The invention relates in general to a semiconductor device, and more particularly to a semiconductor device in which a peripheral circuit portion and an array portion are vertically stacked.

Description of the Related Art

Recently, in order to reduce the size of a chip, a semiconductor structure in which a memory array portion is vertically stacked on a peripheral circuit portion (that is, a Circuit under array (CUA)) is increasingly popular. In this kind of structure, the memory array portion generally includes a semiconductor substrate, a multilayers stack configured by a plurality of insulating layers and a plurality of poly-silicon layers alternatively stacked with each other provided on the semiconductor substrate, a memory layer with SiON-oxide-nitride-oxide, oxide-nitride-oxide-nitride-oxide (BE-SONOS) or charge trapping memories structure and a poly-silicon channel layer formed in sequence on the sidewalls of a through hole/trench penetrating the multilayers stack; a plurality of memory cells defined at the intersection points formed by the channel layer, the memory layer and the poly-silicon layers; and the memory cells are electrically connected to the semiconductor substrate that can serve as a bottom common source line for performing a block erasing operation of the memory array portion through the channel layer.

However, after the process of the semiconductor device (for example, a thermal process), the N-type dopant in the semiconductor substrate is easily diffused upward through the channel layer, thereby affecting the function of the ground selection line device adjacent to the substrate.

Accordingly, it is desirable to provide a vertical channel flash memory device that addresses the problems faced by the prior art.

SUMMARY OF THE INVENTION

The present invention relates to a semiconductor device. Since the substrate of the semiconductor device of the present invention has a lower doping concentration (e.g. less than $5 \times 10^{18}$ cm$^{-3}$) in the N-type doping regions, the diffusion of the N-type dopant of the substrate of the semiconductor device to the channel layer which affects the ground select line device (GSL device) can be alleviated. Therefore, the utilization of the ground selection line device can be improved.

According to one aspect of the present invention, a semiconductor device is provided. The semiconductor device includes a substrate, a first stack and a second stack. The substrate has an upper surface, wherein the substrate includes a doped region extending downward from the upper surface, the doped region having a first doping concentration. The first stack disposed on the upper surface, wherein the first stack includes a plurality of first insulating layers and a plurality of first conductive layers which are alternately stacked, a first channel layer, a first memory layer and a first conductive connector. The first conductive layer is configured to receive a first voltage. The first channel layer penetrates through the first stack. The first memory layer surrounds the first channel layer. The first conductive connector is disposed on the first channel layer and has a second doping concentration. The second stack disposed on the first conductive connector and over the first stack. The second stack includes a plurality of second insulating layers and a plurality of second conductive layers which are alternately stacked, a second channel layer, a second memory layer, and a second conductive connector. The second conductive layer is configured to receive a second voltage different from the first voltage. The second channel layer penetrates through the second stack and the second memory layer surrounds the second channel layer. The second conductive connector is disposed on the second channel layer. The second conductive connector has a third doping concentration and is configured to receive an erasing voltage. The first conductive connector is electrically connected to the first channel layer and the second channel layer. The first doping concentration is less than the second doping concentration and the third doping concentration.

According to another aspect of the present invention, a method for operating a semiconductor device is provided. The operating method comprises the following steps. Firstly, a semiconductor device is provided. The semiconductor device includes a substrate, a first stack and a second stack. The substrate has an upper surface, wherein the substrate includes a doped region extending downward from the upper surface, the doped region having a first doping concentration. The first stack disposed on the upper surface, wherein the first stack includes a plurality of first insulating layers and a plurality of first conductive layers which are alternately stacked, a first channel layer, a first memory layer and a first conductive connector. The first channel layer penetrates through the first stack. The first memory layer surrounds the first channel layer. The first conductive connector is disposed on the first channel layer and has a second doping concentration. The second stack disposed on the first conductive connector and over the first stack. The second stack includes a plurality of second insulating layers and a plurality of second conductive layers which are alternately stacked, a second channel layer, a second memory layer, and a second conductive connector. The second channel layer penetrates through the second stack and the second memory layer surrounds the second channel layer. The second conductive connector is disposed on the second channel layer. The second conductive connector has a third doping concentration. The first conductive connector is electrically connected to the first channel layer and the second channel layer. The first doping concentration is less than the second doping concentration and the third doping concentration. Next, an erasing voltage is applied to the second conductive connector during an erasing operation. A first voltage is applied to the first conductive layers during the erasing operation. A second voltage is applied to the second conductive layers during the erasing operation. The second voltage is greater than the first voltage.

The above and other aspects of the invention will become better understood with regard to the following detailed description of the preferred but non-limiting embodiment(s), The following description is made with reference to the accompanying drawings.

DETAILED DESCRIPTION OF THE INVENTION

Figure 1:
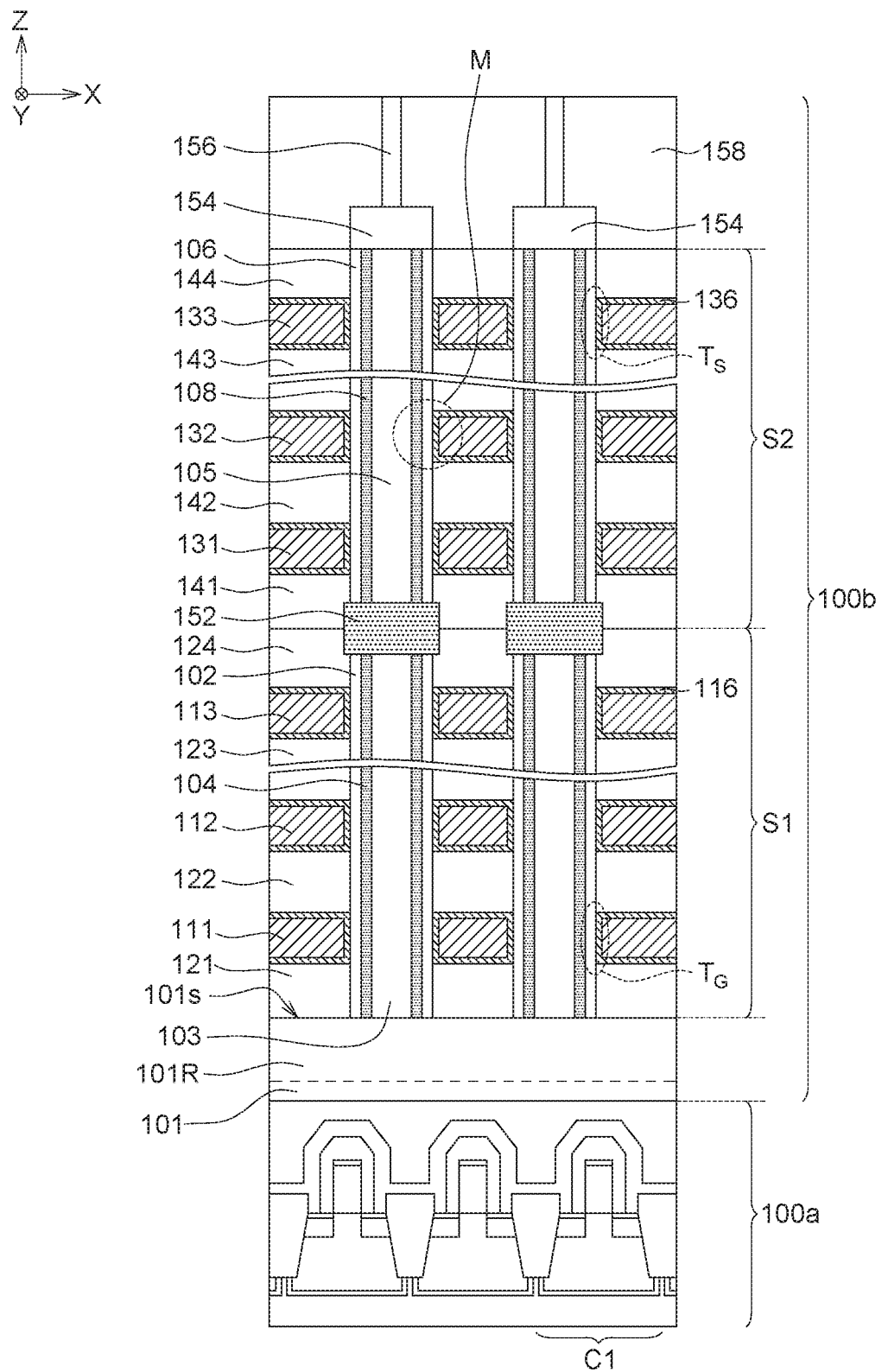
FIG. 1 is a cross-sectional view of a semiconductor device in accordance with an embodiment of the present invention.

FIG. 1 is a cross-sectional view of a semiconductor device 10 according to an embodiment of the present invention.

Referring to FIG. 1, the semiconductor device 10 includes a peripheral circuit portion 100a and an array portion 100b. The array portion 100b is disposed on the peripheral circuit portion 100a. The peripheral circuit part 100a includes a Complementary Metal-Oxide-Semiconductor structure (CMOS) C1 and other suitable structures. The array portion 100b includes a substrate 101, a first stack S1, a second stack S2, an interconnection via 156, and a cover layer 158. The second stack S2 is disposed over the first stack S1. The substrate 101 has an upper surface 101s and includes a doped region 101R extending downward from the upper surface 101s. The peripheral circuit portion 100a disposed under the substrate 101. In some embodiments, the array portion 100b including the first stack S1 and the second stack S2 overlaps with the peripheral circuit portion 100a in the normal direction of the upper surface 101s.

The array portion 100b of the present invention exemplarily describes an embodiment of a memory structure of a gate-all-around (GAA), but the present invention is not limited thereto, and the array portion 100b of the present invention may be any non-volatile memory structure of a nitride-based memory material.

The first stack S1 is disposed on the upper surface 101s, wherein the first stack S1 includes a plurality of first insulating layers 121 to 124 . . . and a plurality of first conductive layers 111 to 113 . . . which are alternately stacked along the Z-axis direction. FIG. 1 exemplarily shows three first conductive layers 111 to 113 and four first insulating layers 121 to 124 in the first stack S1, but the present invention is not limited thereto. More conductive layers and insulating layers may be included in the first stack S1. In the present embodiment, the first insulating layers 121 and 124 are respectively located on the bottom layer and the top layer of the first stack S1 and the first insulating layer 121 is in direct contact with the substrate 101. The first conductive layers 111 to 113 are configured to receive a first voltage $V_1$ (shown in FIG. 2). A first insulating pillar 103, a first channel layer 104, and a first memory layer 102 vertically penetrate the first stack S1 (for example, along the Z-axis direction). The first channel layer 104 and the first memory layer 102 surround the first insulating pillar 103. The first memory layer 102 surrounds the first channel layer 104. The first memory layer 102 is disposed between the first channel layer 104, the first insulating layers 121-124, and the first conductive layers 111-113. A first conductive connector 152 is disposed on the first memory layer 102, the first insulating pillar 103 and the first channel layer 104, and electrically contacts the first channel layer 104. A first dielectric layer 116 is disposed between the first memory layer 102, the first insulating layers 121-124, and the first conductive layers 111-113, and can surround the first conductive layers 111-113.

The second stack S2 is disposed on the first stack S1, wherein the second stack S2 includes a plurality of second insulating layers 141 to 144 . . . and a plurality of second conductive layers 131 to 133 . . . which are alternately stacked along the Z axis direction. FIG. 1 exemplarily shows three second conductive layers 131 to 133 and four second insulating layers 141 to 144 in the second stack S2, but the present invention is not limited thereto. More conductive layers and insulating layers may be included in the second stack S2.

In the present embodiment, the second insulating layers 141 and 144 are located at the bottom layer and the top layer of the second stack S2, respectively. The second conductive layers 131 to 133 are configured to receive a second voltage $V_2$ (shown in FIG. 2) different from the first voltage $V_1$. In some embodiments, the second voltage $V_2$ is greater than the first voltage $V_1$. A second insulating pillar 105, a second channel layer 108, and a second memory layer 106 vertically penetrate the second stack S2 (for example, along the Z-axis direction). The second channel layer 108 and the second memory layer 106 surround the second insulating pillar 105. The second memory layer 106 surrounds the second channel layer 108. The second memory layer 106 is disposed between the second channel layer 108, the second insulating layers 141-144, and the second conductive layers 131-133. A second conductive connector 154 is disposed on the second insulating pillar 105, the second memory layer 106 and the second channel layer 108, and electrically contacts the second channel layer 108. The second conductive connector 154 is configured to receive an erasing voltage $V_{er}$ (shown in FIG. 2). The first conductive connector 152 is disposed between the first channel layer 104 and the second channel layer 108, and is electrically connected to the first channel layer 104 and the second channel layer 108. The second dielectric layer 136 is disposed between the second memory layer 106, the second insulating layers 141-144, and the second conductive layers 131-133, and can surround the second conductive layers 131-133. The interconnection via 156 electrically contacts the second conductive connector 154. The cover layer 158 is disposed on the second stack S2.

In some embodiments, the substrate 101 is, for example, a silicon substrate or other suitable substrates, such as an N-type doped poly-silicon substrate. The first conductive connector 152 and the second conductive connector 154 are, for example, N-type doped poly-silicon layers. The doped region 101R, the first conductive connector 152, and the second conductive connector 154 of the substrate 101 can be doped with N-type dopants, and have a first doping concentration, a second doping concentration, and a third doping concentration, respectively. The first doping concentration may be different from the second doping concentration and the third doping concentration. For example, the first doping concentration may be less than $5 \times 10^{16}$ cm$^{-3}$, and the second and third doping concentrations may be greater than $1 \times 10^{19}$ cm$^{-3}$, respectively. In some embodiments, the first doping concentration is less than the second doping concentration and the third doping concentration, and the second doping concentration may be the same as the third doping concentration. In some embodiments, the second doping concentration is less than the third doping concentration. Compared with the comparative example in which the substrate has a high concentration of N-type dopants (such as greater than $1 \times 10^{19}$ cm$^{-3}$), the first doping concentration of the doped region 101R of the substrate 101 of the present invention is lower, which can reduce the dissipation of the N-type dopants to the first channel layer 104, so that the condition, in which the ground selection line devices adjacent to the substrate 101 (such as transistors formed at the intersections between the first conductive layers 111, 112 and the first memory layer 102) are affected by the N-type dopants to be continuously on and can not perform normal function, can be alleviated.

For example, the first conductive layer 111 closest to the substrate 101 among the first conductive layers 111 to 113 can be used as a ground select line (GSL), and the intersection between the first conductive layer 111 closest to the substrate 101, a first memory layer 102 and a channel layer 104 may form a ground select line transistor $T_G$. The second conductive layer 133 closest to the second conductive connector 154 among the second conductive layers 131 to 133 can be used as a string select line (SSL), and the intersection between the second conductive layer 133 closest to the second conductive connector 154, the second memory layer 106 and the second channel layer 108 may form a string select line transistor $T_S$. The first conductive layers 112, 113 . . . and the second conductive layers 131, 132 . . . disposed between the ground select line and the string select line can serve as word lines (WL). Each of intersections of the first conductive layers 112, 113 . . . , the second conductive layers 131, 132 . . . , the first memory layer 102, the second memory layer 106, the first channel layer 104 and the second channel layer 108 can form a memory cell M for storing data. The memory cells M defined by the first conductive layer 112, 113 . . . , the second conductive layers 131, 132 . . . , the first memory layer 102, the second memory layer 106, the first channel layer 104 and the second channel layer 108 can be electrically coupled to a decoder, such as a row decoder or a column decoder (not shown), through the bit lines (not shown).

If the first channel layer 104 adjacent to the first conductive layer 111 is interfered by the N-type dopant, the first conductive layer 112 above the first conductive layer 111 can be used as the ground selection line, and the intersection between the first conductive layer 112, the first memory layer 102 and the first channel layer 104 can be used as a ground select line transistor; if the first channel layer 104 adjacent to the first conductive layer 112 is interfered by an N-type dopant, the first conductive layer above the first conductive layer 112 can be used as the ground select line, and the intersection between the first conductive layer above the first conductive layer 112, the first memory layer 102 and the first channel layer can be used as the ground select line transistor; and so on.

In some embodiments, the materials of the first insulating layers 121 to 124, the first conductive layers 111 to 113, the first channel layer 104; the first memory layer 104, and the first insulating pillar 103 may be the same or similar to that of the second insulating layers 141 to 144, the second conductive layers 131 to 133, the second channel layer 108, the second memory layer 106, and the second insulating pillar 105, respectively. The first insulating layers 121 to 124, the first insulating pillar 103, the second insulating layers 141 to 144, the second insulating pillar 105, and the cover layer 158 may be formed of an oxide, such as silicon dioxide ($SiO_2$). The first conductive layers 111 to 113 and the second conductive layers 131 to 133 may be formed of a conductive material; such as tungsten (W), titanium nitride (TiN), tantalum nitride (TaN), or other suitable materials. The first memory layer 102 and the second memory layer 106 may be composed of a composite layer (i.e., an ONO layer) including a silicon oxide layer, a silicon nitride layer, and a silicon oxide layer. For example, the first memory layer 102 and the second memory layer 106 may include a tunneling layer, a trapping layer, and a barrier layer, respectively. The tunneling layer may include a double-layer structure formed by Oxynitride (SiON) and silicon dioxide ($SiO_2$) or other suitable materials. The trapping layer may include silicon nitride or other suitable materials. The barrier layer may include silicon dioxide ($SiO_2$) or other suitable materials. The first dielectric layer 116 and the second dielectric layer 136 may include a high-k material, such as aluminum oxide ($Al_2O_3$) or other suitable materials. The first channel layer 104 and the second channel layer 108 may be single crystal silicon layer or poly-silicon layer (can also be the epitaxial growth layers).

The first channel layer 104 and the second channel layer 108 of the embodiments of the present invention are respectively formed under different process steps, and are not formed together by forming a channel opening in a single etching process and filling a channel material into the channel opening. With the increase in the number of word lines, it is necessary to form a high-aspect-ratio memory stack structure, and the formation of vertical channels is increasingly challenged. If vertical channel openings are formed by a single etching process, it is easy to cause a process defect, and may fail to form a channel layer with good electrical connection. Therefore, compared with the comparative example in which the channel opening is generally formed by a single etching process, in the present application, since the second channel 108 is formed in the second stack S2 after the first channel layer 104 is formed in the first stack S1 by a different process, the above problem in the manufacturing process can be solved, so that the first channel layer 104 and the second channel layer 108 can have a good electrical connection with the substrate 101 through the first conductive connector 152.

Figure 2:
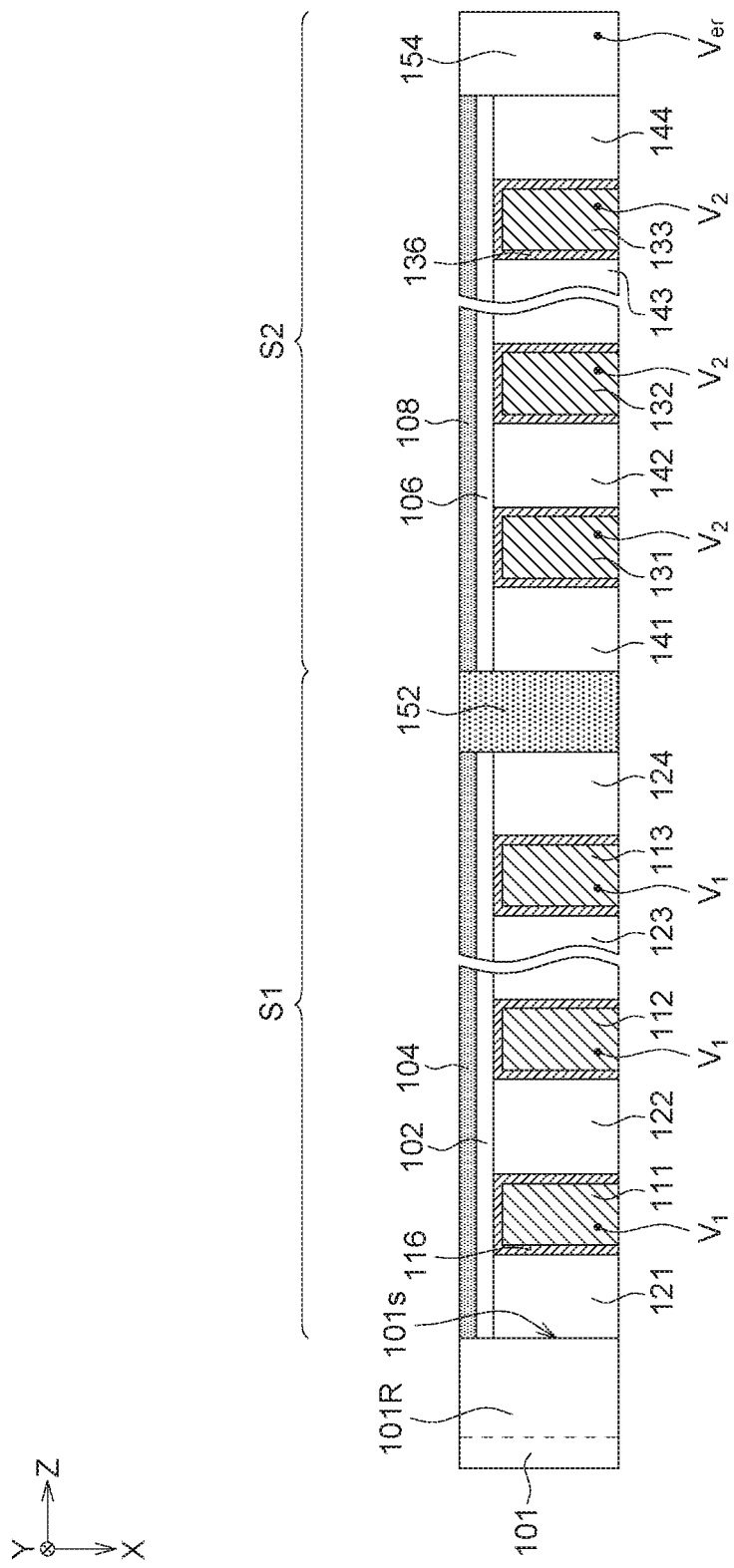
FIG. 2 is a cross-sectional view showing a method of an erasing operation of a semiconductor device in accordance with an embodiment of the present invention.

FIG. 2 is a cross-sectional view illustrating a method of an erasing operation of the semiconductor device 10 according to an embodiment of the present invention.

Referring to FIGS. 1 and 2, during an erasing operation, an erasing voltage $V_{er}$ is applied to the second conductive connector 154 through a bit line (not shown), and a band to band tunneling (BTB tunneling) mechanism raises the potential of the second channel layer 108 and then holes are injected into the second memory layer 106. During this erasing operation, the potential of the first conductive connector 152 is increased by the high potential of the second channel layer 108, and the potential of the first channel layer 104 is further increased by another band to band tunneling mechanism, and then holes are injected into the first memory layer 102, wherein the first channel layer 104 and the second channel layer 108 have a first internal voltage and a second internal voltage different from the first internal voltage, respectively. In some embodiments, the second internal voltage is greater than the first internal voltage. Because there is a voltage difference between the first internal voltage and the second internal voltage, during this erasing operation, it is necessary to apply a first voltage $V_1$ to the first conductive layer 111 to 113 . . . and apply a second voltage $V_2$ different from the first voltage $V_1$ is applied to the second conductive layers 131 to 133, so that the erasing speed of all the memory cells M of the first stack S1 and the second stack S2 can be consistent. In addition, during the erasing operation, the substrate 101 and the first conductive connector 152 are floating, That is, no voltage is applied to the substrate 101 and the first conductive connector 152.

In some embodiments, the second voltage $V_2$ is greater than the first voltage $V_1$; the erasing voltage $V_{er}$ is greater than the first voltage $V_1$ and the second voltage $V_2$; the voltage difference between the first voltage $V_1$ and the first internal voltage is equal to the voltage difference between the second voltage $V_2$ and the second internal voltage. In some embodiments, the voltage difference between the second voltage $V_2$ and the first voltage $V_1$ is greater than 0 and less than 5 V.

Compared with the comparative example in which the erasing voltage is applied to the substrate, since the erasing voltage Ver according to one embodiment of the present invention is applied to the second conductive connector 154, the substrate 101 is floating, and the diffusion extent of the N-type dopant diffused from the substrate 101 to the first channel layer 104 can be reduced, so that the use of the ground select line device can be avoided from being wasted. For example, in a comparative example in which an erasing voltage is applied to a substrate, at least three ground selection line devices adjacent to the substrate cannot perform normal functions, and in the present invention, the number of ground selection line devices that cannot be used can be reduced to two or less. In this way, the semiconductor device 10 of the present invention can be used more efficiently.

Figure 3:
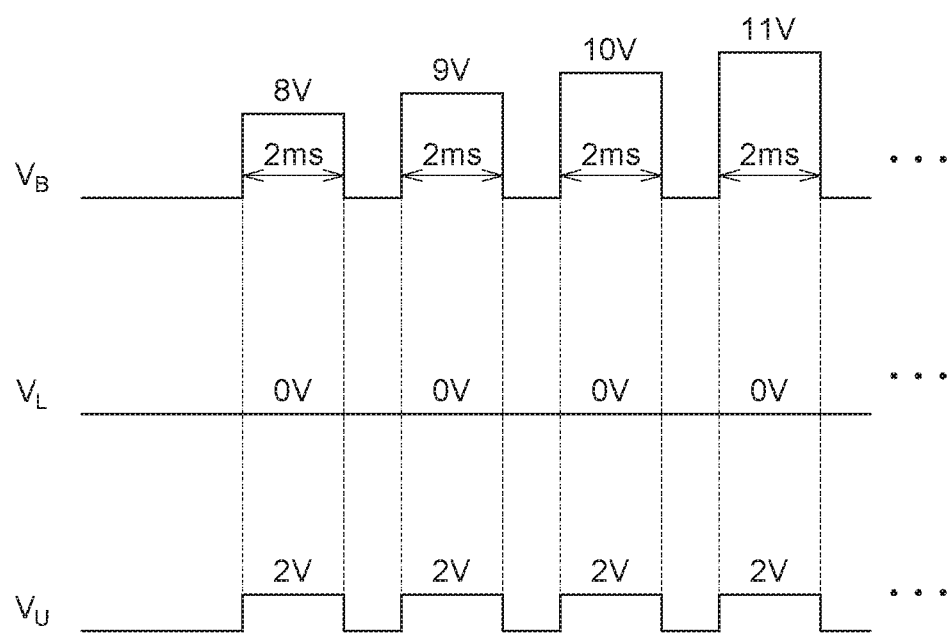
FIG. 3 is a waveform diagram of an erasing operation of a semiconductor device in accordance with an embodiment of the present invention.

FIG. 3 is a waveform diagram of an erasing operation of the semiconductor device 10 according to an embodiment of the present invention.

Referring to FIG. 3, it illustrates the waveform evolution of the semiconductor device 10 performed by the incremental step pulse erase (ISPE). The bit line voltage $V_B$ indicates the waveform evolution of the bit line voltage with time when the erasing voltage $V_{er}$ is applied to the second conductive connector 154 by a bit line (not shown). The first conductive layer voltage $V_L$ indicates the waveform evolution of the first conductive layers 111 to 113 . . . with time when the first voltage $V_1$ is applied to the first conductive layers 111 to 113 . . . in the first stack S1. The second conductive layer voltage $V_U$ indicates the waveform evolution of the second conductive layers 131 to 133 . . . with time when the second voltage $V_2$ is applied to the second conductive layers 131 to 133 . . . in the second stack S2. It can be seen from the results in FIG. 3 that the erasing voltage $V_{er}$ gradually increases with time (for example, it increases by 1V every 2 milliseconds), the first voltage $V_1$ maintains 0V, and the second voltage $V_2$ maintains 2V.

According to the above embodiments, the present invention provides a semiconductor device and a method of operating the same. The semiconductor device includes a substrate, a first stack, and a second stack. The substrate has an upper surface, wherein the substrate includes a doped region extending downward from the upper surface, the doped region having a first doping concentration. The first stack is disposed on the upper surface, wherein the first stack includes a plurality of first insulating layers and a plurality of first conductive layers which are alternately stacked, a first channel layer, a first memory layer and a first conductive connector. The first conductive layers are configured to receive a first voltage. The first channel layer penetrates the first stack. The first memory layer surrounds the first channel layer. The first conductive connector is disposed on the first channel layer and has a second doping concentration. The second stack is disposed on the first conductive connector and over the first stack. The second stack includes a plurality of second insulating layers and a plurality of second conductive layers which are alternately stacked, a second channel layer, a second memory layer, and a second conductive connector. The second conductive layers are configured to receive a second voltage different from the first voltage. The second channel layer penetrates the second stack and the second memory layer surrounds the second channel layer. The second conductive connector is disposed on the second channel layer. The second conductive connector has a third doping concentration and is configured to receive an erasing voltage. The first conductive connector is electrically connected to the first channel layer and the second channel layer. The first doping concentration is less than the second doping concentration and the third doping concentration.

Compared with the comparative example in which the substrate has a heavily doped N-type dopant, the N-type doped region in the substrate of the semiconductor device of the present invention has a lower doping concentration, which can reduce the diffusion extent of the N-type dopant diffused from the substrate to the channel layer, so that the affection to the ground select line device can be improved. In addition, since the erasing voltage is applied to the second conductive connector during the erasing operation, instead of being applied to the substrate, the condition in which the ground select line device adjacent to the substrate is influenced by the N-type dopant to become continuously on and thus unable to perform normal function can be alleviated. Therefore, the utilization of the ground selection line device in the semiconductor device can be improved. Furthermore, by applying different first voltages and second voltages to the first conductive layer and the second conductive layer, respectively, the condition in which the internal voltages of the first channel layer and the second channel layer are different can be overcome, so that the erasing speed of all memory cells of the same string in the first stack and the second stack can be consistent.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor device, comprising:
a substrate having an upper surface, wherein the substrate comprises a doped region extending downward from the upper surface, and the doped region having a first doping concentration;
a first stack disposed on the upper surface, wherein the first stack comprises:
a plurality of first insulating layers and a plurality of first conductive layers which are alternately stacked, wherein the first conductive layers are configured to receive a first voltage;
a first channel layer penetrating the first stack;
a first memory layer surrounding the first channel layer; and
a first conductive connector disposed on the first channel layer and having a second doping concentration;
a second stack disposed on the first stack, wherein the second stack comprises:
a plurality of second insulating layers and a plurality of second conductive layers which are alternately stacked, wherein the second conductive layers are configured to receive a second voltage different from the first voltage;
a second channel layer penetrating the second stack;
a second memory layer surrounding the second channel layer; and
a second conductive connector disposed on the second channel layer, wherein the second conductive connector has a third doping concentration and is configured to receive an erasing voltage, wherein the first conductive connector is electrically connected to the first channel layer and the second channel layer;

wherein the first doping concentration is smaller than the second doping concentration and the third doping concentration.

2. The semiconductor device according to claim 1, wherein the first doping concentration is smaller than $5 \times 10^{18}$ cm$^{-3}$.

3. The semiconductor device according to claim 1, wherein the second doping concentration is greater than $1 \times 10^{19}$ cm$^{-3}$.

4. The semiconductor device according to claim 1, wherein the second voltage is greater than the first voltage.

5. The semiconductor device according to claim 4, wherein a voltage difference between the first voltage and the second voltage is smaller than 5 V.

6. The semiconductor device according to claim 1, further comprising:
  a first insulating pillar and a second insulating pillar respectively penetrating the first stack and the second stack, wherein the first insulating pillar is surrounded by the first channel layer and the first memory layer, the second insulating pillar is surrounded by the second channel layer and the second memory layer; and
  an interconnection via electrically connected to the second conductive connector.

7. The semiconductor device according to claim 1, further comprising a peripheral circuit portion disposed under the substrate.

8. The semiconductor device according to claim 7, wherein an array portion including the first stack and the second stack overlaps with the peripheral circuit portion in a normal direction of the upper surface.

9. A method for operating a semiconductor device, the operating method comprising:
  providing the semiconductor device, the semiconductor device comprising:
    a substrate having an upper surface, wherein the substrate comprises a doped region extending downward from the upper surface, and the doped region having a first doping concentration;
    a first stack disposed on the upper surface, wherein the first stack comprises:
      a plurality of first insulating layers and a plurality of first conductive layers which are alternately stacked;
      a first channel layer penetrating the first stack;
      a first memory layer surrounding the first channel layer; and
      a first conductive connector disposed on the first channel layer and having a second doping concentration;
    a second stack disposed on the first stack, wherein the second stack comprises:
      a plurality of second insulating layers and a plurality of second conductive layers which are alternately stacked;
      a second channel layer penetrating the second stack;
      a second memory layer surrounding the second channel layer; and
      a second conductive connector disposed on the second channel layer, wherein the second conductive connector has a third doping concentration, wherein the first conductive connector is electrically connected to the first channel layer and the second channel layer;
    wherein the first doping concentration is smaller than the second doping concentration and the third doping concentration;
  applying an erasing voltage to the second conductive connector during an erasing operation;
  applying a first voltage to the first conductive layers during the erasing operation; and
  applying a second voltage to the second conductive layers during the erasing operation;
  wherein the second voltage is greater than the first voltage.

10. The method according to claim 9, wherein the first doping concentration is smaller than $5 \times 10^{18}$ cm$^{-3}$.

11. The method according to claim 9, wherein the second doping concentration is greater than $1 \times 10^{19}$ cm$^{-3}$.

12. The method according to claim 9, wherein the first channel layer and the second channel layer respectively form a first internal voltage and a second internal voltage different from the first internal voltage during the erasing operation.

13. The method according to claim 9, wherein a voltage difference between the first voltage and the second voltage is smaller than 5 V.

14. The method according to claim 12, wherein the second internal voltage is greater than the first internal voltage.

15. The method according to claim 14, wherein a voltage difference between the first voltage and the first internal voltage is equal to a voltage difference between the second voltage and the second internal voltage.

16. The method according to claim 9, wherein during the erasing operation, the substrate is floating.

17. The method according to claim 9, wherein during the erasing operation, the first conductive connector is floating.

18. The method according to claim 9, wherein during the erasing operation, the erasing voltage is greater than the first voltage and the second voltage.

* * * * *